(12) United States Patent
Daubenspeck et al.

(10) Patent No.: US 8,114,767 B2
(45) Date of Patent: Feb. 14, 2012

(54) STRUCTURE, SEMICONDUCTOR STRUCTURE AND METHOD OF MANUFACTURING A SEMICONDUCTOR STRUCTURE AND PACKAGING THEREOF

(75) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US); Jeffrey S. Zimmerman, Swanton, VT (US)

(73) Assignee: International Business Machines Corporation, Armonk, NY (US)

( * ) Notice: Subject to any disclaimer, the term of this patent is extended or adjusted under 35 U.S.C. 154(b) by 738 days.

(21) Appl. No.: 12/046,616

(22) Filed: Mar. 12, 2008

(65) Prior Publication Data
US 2009/0230547 A1 Sep. 17, 2009

(51) Int. Cl.
*H01L 21/4763* (2006.01)

(52) U.S. Cl. ......... 438/622; 438/637; 438/640; 438/643

(58) Field of Classification Search .......... 438/622–678, 438/E23.02, E23.161
See application file for complete search history.

(56) References Cited

U.S. PATENT DOCUMENTS

| | | | |
|---|---|---|---|
| 6,040,552 A | 3/2000 | Jain et al. | |
| 6,610,595 B2 * | 8/2003 | Seshan | 438/652 |
| 7,071,575 B2 * | 7/2006 | Wu et al. | 257/786 |
| 7,263,677 B1 | 8/2007 | Teig et al. | |
| 2003/0074173 A1 | 4/2003 | Monroe | |
| 2005/0056913 A1 | 3/2005 | Farnworth | |
| 2005/0105682 A1 | 5/2005 | Heumann et al. | |
| 2005/0182584 A1 | 8/2005 | Plusquellic | |
| 2006/0006503 A1 | 1/2006 | Farnworth | |

* cited by examiner

*Primary Examiner* — Cuong Q Nguyen
(74) *Attorney, Agent, or Firm* — Anthony Canale; Roberts Mlotkowski Safran & Cole, P.C.

(57) ABSTRACT

A design structure is embodied in a machine readable medium for designing, manufacturing, or testing a design. The design structure includes a dielectric material formed between a design sensitive structure and a passivation layer. The design sensitive structure comprising a lower wiring layer electrically and mechanically connected to a higher wiring level by a via farm. A method and structure is also provided.

8 Claims, 7 Drawing Sheets

STRUCTURE, SEMICONDUCTOR STRUCTURE AND METHOD OF MANUFACTURING A SEMICONDUCTOR STRUCTURE AND PACKAGING THEREOF

FIELD OF THE INVENTION

The present invention generally relates to a design structure for preventing BEOL (Back-End-Of-Line) delamination underneath solder bumps in a semiconductor device, a semiconductor structure and method of manufacture and, more particularly, to a structure using a dielectric material to prevent a wiring layer from delaminating during packaging, a design structure a method of manufacturing.

BACKGROUND OF THE INVENTION

Traditionally high temperature C4 (Controlled Collapse Chip Connection) bumps have been used to bond a chip to a substrate. Conventionally, the C4 bumps are made from leaded solder, as it has superior properties. For example, lead is known to mitigate thermal coefficient (TCE) mismatch between the package and the substrate (i.e., organic laminate). Accordingly, stresses imposed during the cooling cycle were mitigated by the lead C4 bumps, thus preventing wiring layers from delaminating or other damage from occurring to the chip or the substrate.

However, lead-free requirements are now being imposed by many countries forcing manufacturers to implement new ways to produce chip to substrate joints. For example, solder interconnects consisting of tin/copper, tin/silver and SAC alloys have been used as a replacement for leaded solder interconnents. However, low ductility of such tin rich solders vs. leaded solders (Young's modulus of Sn 50 GPA vs. Pb 16 GPA) causes a transfer of stress through the C4 joint during assembly process (e.g., during a cooling cycle after reflow). Cracks in chip metallurgy under C4 bumps have been observed, which are named "white bumps" due to their appearance in sonoscan type inspection processes.

More specifically, in practice, the organic laminate has a TCE of about 18 to 20; whereas, the TCE of the chip is about 2. During the soldering process, e.g., reflow oven, the temperatures can range from about 250° C. to 260° C. This high temperature expands the organic laminate more than the chip due to the differences in the TCE. As the package (laminate, solder and chip) begins to cool, the solder begins to solidify (e.g., at about 180° C.) and the laminate begins to shrink as the chip remains substantially the same size. As the solder is robust and exceeds the strength of the chip, tensile stresses can exceed the yield strength of chip and can begin to delaminate structures on the chip. For example, it has been found that the wiring layers of the chip have delaminated due to the tensile stresses originating from the laminate and imposed from the solder bump to the chip. This process and resulting delamination is shown, for example, in FIG. 1.

Accordingly, there exists a need in the art to overcome the deficiencies and limitations described hereinabove.

SUMMARY OF THE INVENTION

In a first aspect of the invention, a structure comprises a dielectric material formed between a design sensitive structure and a passivation layer. The design sensitive structure comprises at least a portion of a higher wiring layer electrically and mechanically connected to an underlying via farm.

In an additional aspect of the invention, a method comprises: forming a design sensitive structure comprising a portion of a higher wiring layer electrically and mechanically connected to an underlying via farm; forming a dielectric layer over the design sensitive structure; forming an opening in the dielectric layer to expose a portion of the higher metal layer that is away from the via farm, wherein a portion of the dielectric material remains to protect the design sensitive structure; forming a passivation layer over the dielectric material and the opening; and forming an opening in the passivation layer at least partially aligned with the opening in the dielectric material.

In a further aspect of the invention, a design structure is embodied in a machine readable medium for designing, manufacturing, or testing an integrated circuit. The design structure comprises a dielectric material formed between a design sensitive structure and a passivation layer. The design sensitive structure comprises a lower wiring layer electrically and mechanically connected to a higher wiring level by a via farm.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention generally relates to a design structure for preventing a wiring layer from delaminating from a semiconductor device (chip) during packaging, a semiconductor structure and method of manufacture. More specifically, the invention relates to semiconductor structures having a dielectric material formed between a wiring layer and a C4 bump to prevent the wiring layer from delaminating during packaging. To even further reduce the possibility of package failure, a passivation layer may also remain between the wiring layer and the C4 bump. The invention also includes a method of manufacturing such structures, a design structure and a package using the structures.

By implementing the invention, certain design structures, e.g., vias in the copper levels of a chip, are reinforced thereby ensuring that the wiring connections in the semiconductor structure maintain their integrity during packaging. More specifically, the present invention provides the ability of the wiring levels to maintain their integrity during cooling when the laminate substrate is contracting at a faster rate than the chip due to a mismatch in TCE. To accomplish the advantages of the present invention, a dielectric is formed between the C4 bump and the back of the line (BEOL) metallization. The dielectric material adds strength and/or reinforces the metallization such that the tensile stresses imposed by the solder (due to the differences in contraction of the laminate and the chip) will not cause cracking or tearing (generally known as delamination) of the wiring layers. In further embodiments, a passivation layer may be provided over the BEOL metallization.

Structure and Fabrication Processes

Figure 1:
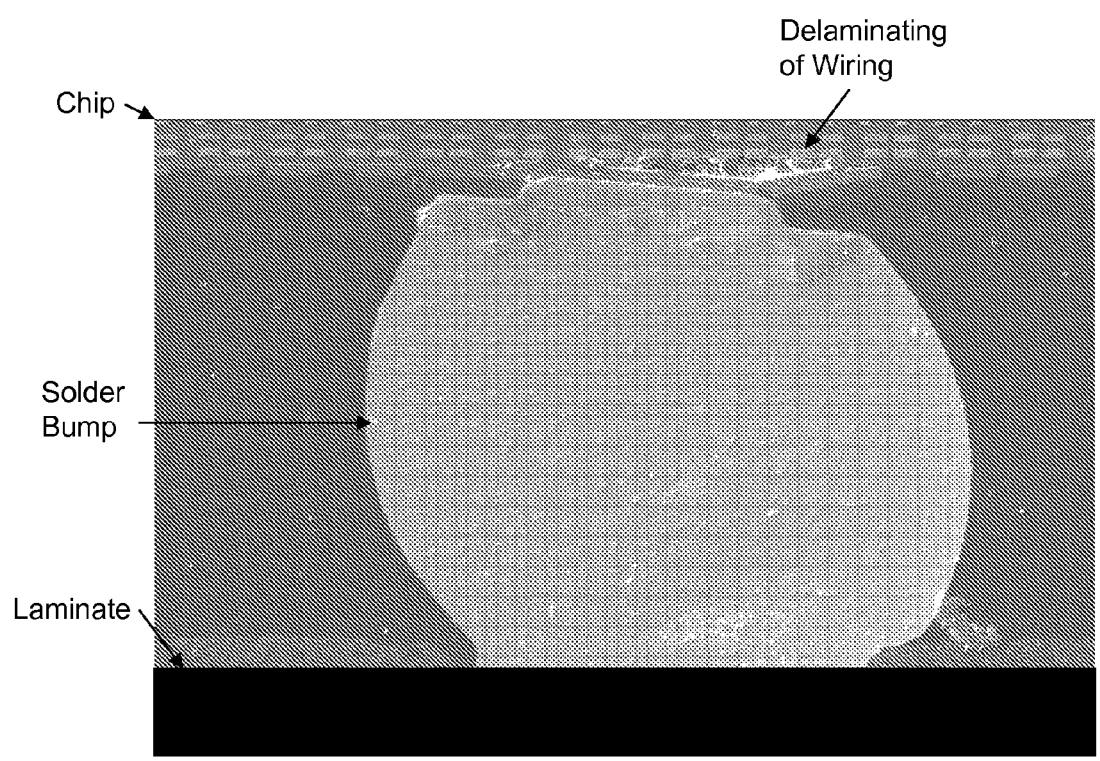
FIG. 1 shows a delaminated wiring layer on a chip after cooling of the package.
Figure 2:
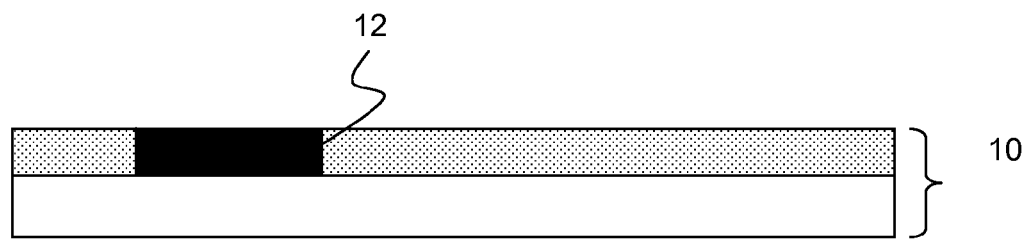
FIGS. 2-6 represent intermediate structures and respective processes for fabricating a structure in accordance with the invention.

FIG. 2 represents a beginning structure and fabricating processes in accordance with the invention. More specifically, FIG. 2 representatively shows a process used in the formation of a lower wiring layer 12 in a laminated structure 10, e.g., wafer and dielectric layers. For example, a dielectric layer may be formed on a wafer and patterned in a conventional lithographic and etching processing to form one or more openings. The openings are then filled with a conductive material such as, for example, copper, to form the lower wiring layer 12. More specifically, a resist is formed over the dielectric material which is patterned using a conventional lithographic process, e.g., expose a portion of the resist to light to form an opening. An etching process such as, for example, a reactive ion etching (RIE) forms an opening into the dielectric material. A metal material, e.g., copper, is deposited into the opening to form the lower wiring layer 12.

Figure 3:
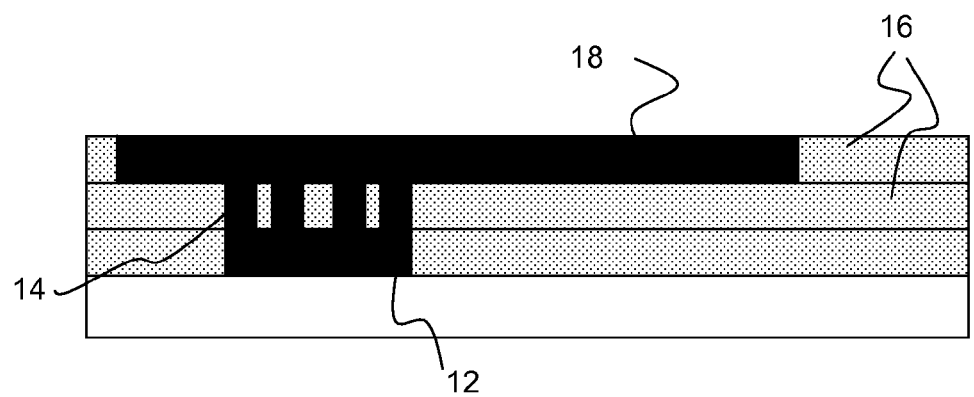

As shown representatively in FIG. 3, additional dielectric layers 16 are deposited over the structure of FIG. 2 to form plated vias 14 and an upper wiring layer 18 using a dual damascene process. As should be understood by those of skill in the art, a dual damascene process is a modified version of the damascene process that is used to form metal interconnect geometry using chemical mechanical polishing (CMP) processes instead of metal etching. In the dual damascene process, two interlayer dielectric patterning steps and one CMP step create a pattern which would otherwise require two patterning steps and two metal CMP steps in a conventional damascene process. In alternate embodiments, although not critical to the understanding of the invention, a conventional damascene process can be used to form the plated vias 14 and the upper wiring layer 18.

In one specific embodiment, the vias and opening are filled with a conductive material e.g., copper, to form the upper wiring layer 18 in contact with the plated vias 14. In embodiments, the upper wiring layer 18 may extend beyond the vias 14, depending on the design. The structure of FIG. 3 may be planarized to form a planar upper surface, ready for additional processes.

It should be recognized that although only two wiring layers are shown, the processes described herein can be repeated for three or more wiring layers. As such, the present invention should not be considered to be limited to only two wiring layers, as any number of wiring layers are contemplated by the invention. Also, the significance of the invention is not in the formation of the wiring layers, but instead is directed to the reinforcement and/or strengthening of the wiring layers (and/or vias) to prevent failure (delaminating, cracking, tearing, etc.) during a cooling of the package during C4 processes. Also, a design sensitive structure, e.g., a portion of the upper wiring layer 18 connected to the lower wiring layer 12 by the vias 14, is prone to delaminating during the soldering process, e.g., during cooling of the package. This failure is due to the higher rate of contraction of the laminate compared to the chip, but which is now prevented due to the processes and structures described herein.

Figure 4:
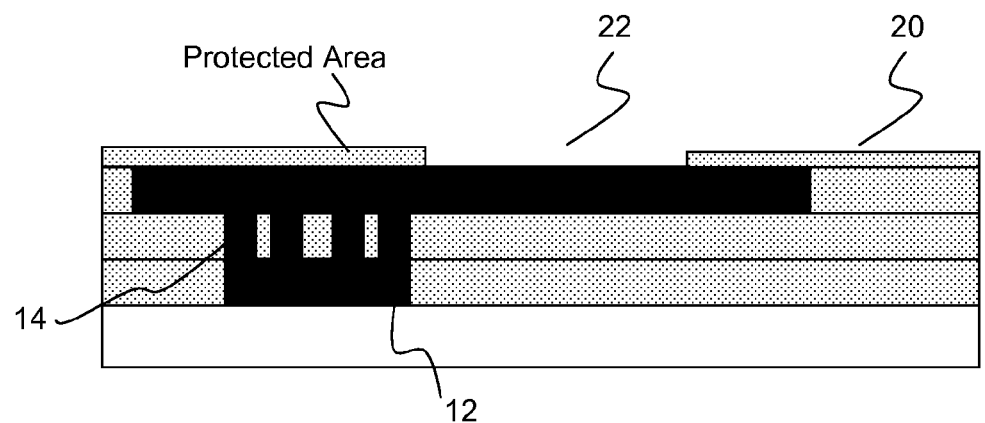

As shown in FIG. 4, a hard dielectric material 20 such as, for example, $SiO_2$, SiN or a combination of $SiO_2$ and SiN is deposited over the structure of FIG. 3. In embodiments, the thickness of the $SiO_2$ is about 0.45 micrometers and the thickness of the SiN material is about 0.4 micrometers; although other thickness are also contemplated by the present invention. As should be understood by those of skill in the art the dielectric material 20 has a higher bonding and shear strength than the material used in the wiring layers 12, 18 and vias 14, e.g., copper. Also, the dielectric material 20 is placed over the location of the design sensitive structure, e.g., over the connection of the vias 14 to the upper wiring layer 18.

Still referring to FIG. 4, an opening 22 is formed in the hard dielectric material 20 using conventional lithographic and etching processes. The opening 22, though, does not extend to over the design sensitive structure, e.g., vias 14 and a portion of the upper wiring layer 18 (as compared to conventional structures). As such, the higher strength dielectric material 20 extends over the location of the design sensitive structure which, in turn, provides added strength and/or reinforcement to the structure thereby preventing a delaminating of the wiring layer 18 and/or vias 14 from the remaining structure. That is, the higher bonding and shear strength of the dielectric material 20 reinforces and/or strengthens the sensitive structures and prevents the wiring from delaminating during solder processing, e.g., cooling of the solder.

Figure 5:
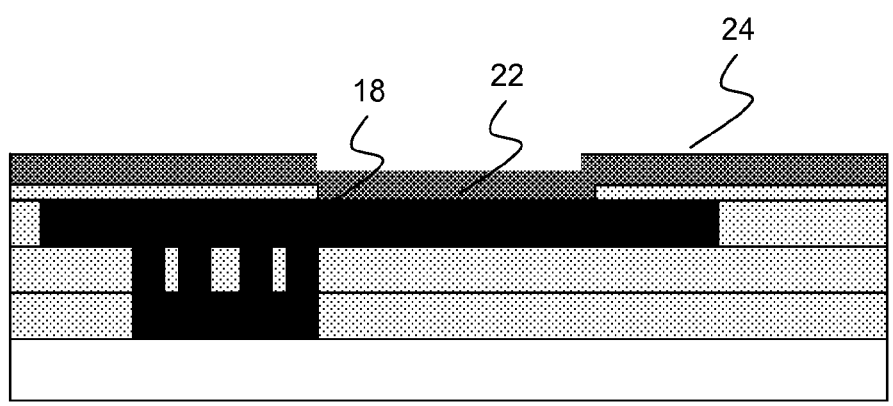

As shown in FIG. 5, a BEOL metal layer 24 is deposited over the structure of FIG. 4. The metal layer, in embodiments, is sputtered aluminum. The aluminum layer 24 contacts the underlying metal layer 18 through the opening 22. The aluminum layer 24 provides electrical and mechanical contact for a solder bump.

Figure 6:
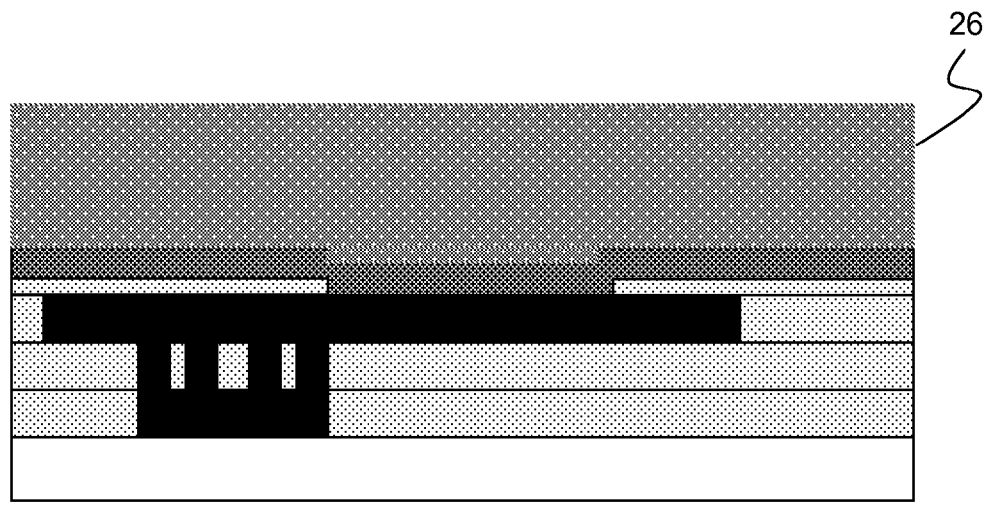

In FIG. 6, a passivation layer 26 is deposited over the structure of FIG. 5. The passivation layer 26 may be, for example, a photosensitive soft passivation layer. More specifically, in embodiments, the passivation layer 26 comprises a photosensitive polyimide (PSPI).

Figure 7:
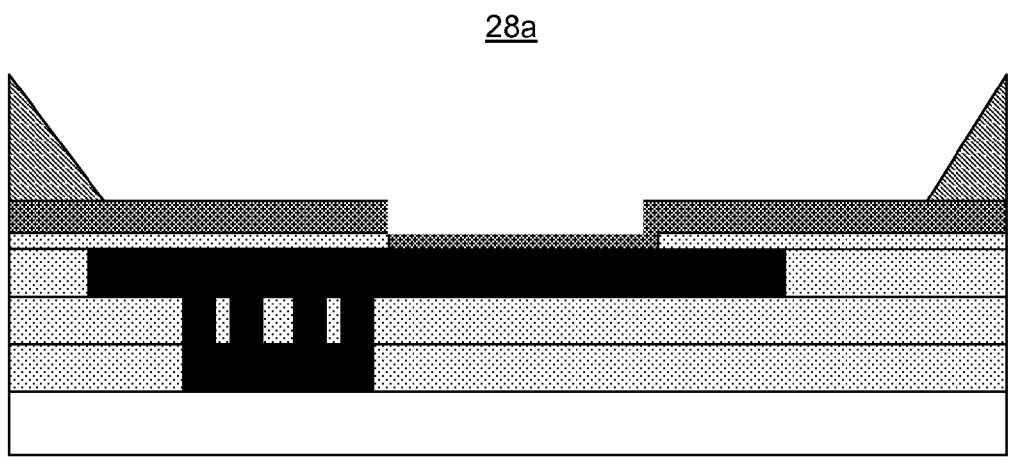
FIG. 7 shows a first alternative structure and respective fabricating processes in accordance with the invention.

As shown in FIG. 7, the passivation layer 26 is patterned using conventional photolithography and developing processes to form an opening 28a. The opening 28a will expose the underlying metallization 24, e.g., aluminum, for further processing. More specifically, as shown in FIG. 7, in embodiments, the opening 28a will extend beyond the opening 24 and hence beyond the dielectric material 20. Thus, in a first embodiment, the opening 28a will expose the underlying metallization 24 at a location over with the design sensitive structure.

Figure 8:
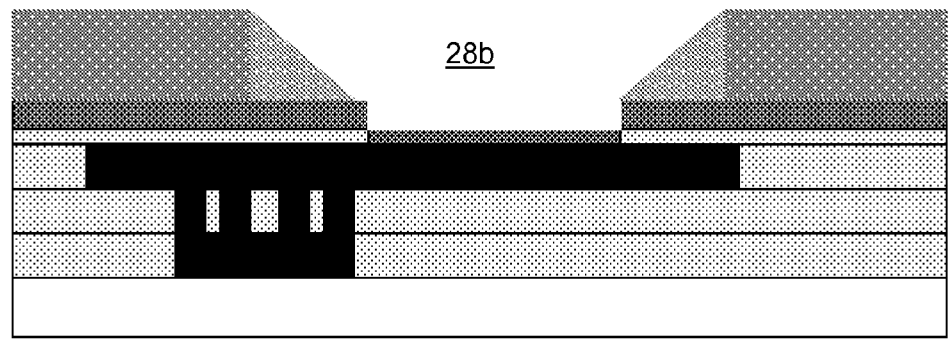
FIG. 8 shows a second alternative structure and respective fabricating processes in accordance with the invention.

In an alternative embodiment as shown in FIG. 8, an opening 28b will be substantially coincident (in alignment) with the opening 22. In this way, the passivation layer 26 will extend over the design sensitive structure and hence provide additional structural integrity and robustness to the structure, e.g., add addition strength and/or reinforcement over the design sensitive area to prevent the wiring from delaminating.

Figure 9:
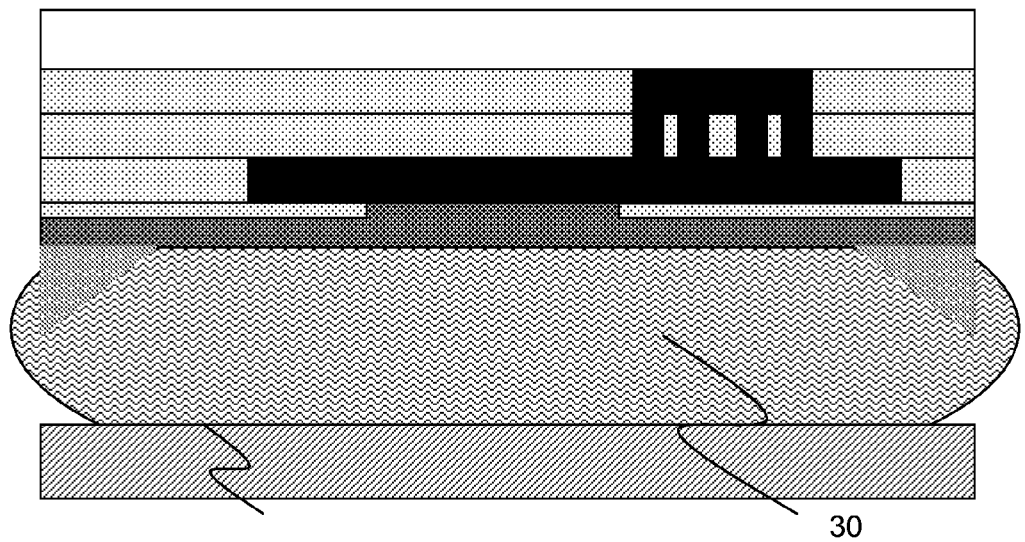
FIG. 9 represents a final packaged product and respective processes for fabricating a packaged device using the structure of FIG. 7.

FIG. 9 represents a final structure and respective processes for fabricating the device using the structure of FIG. 7. More specifically, FIG. 9 shows a solder bump 30 electrically and mechanically connected between the structure of FIG. 7 and a laminate 32. The solder bump 30 may be formed using conventional C4 processes.

Figure 10:
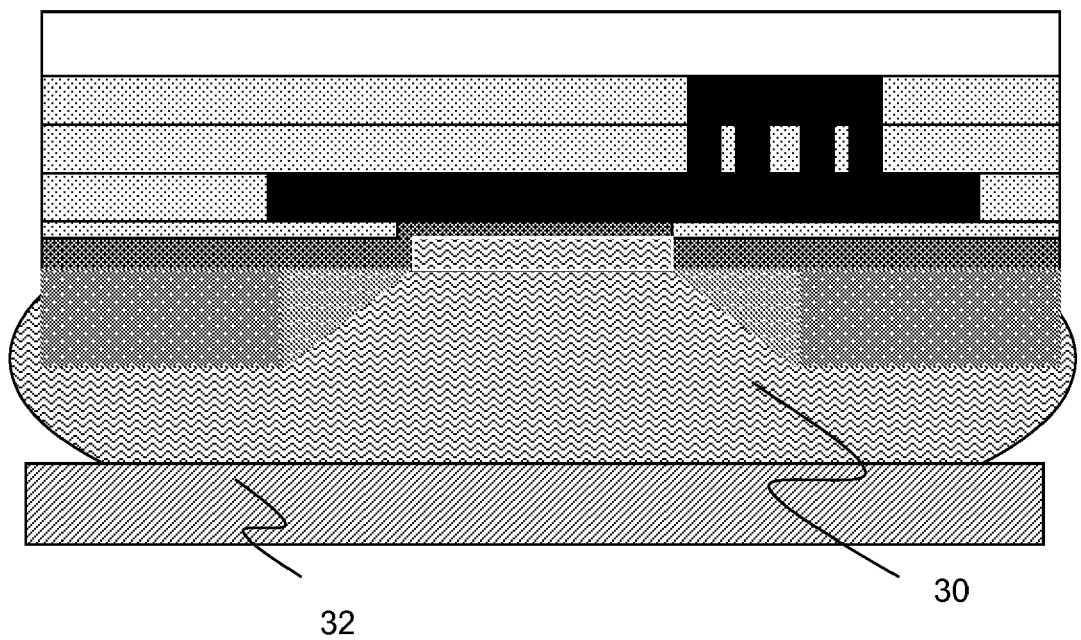
FIG. 10 represents a final packaged product and respective processes for fabricating the packaged device using the structure of FIG. 8.

FIG. 10 represents a final structure and respective processes for fabricating the device using the structure of FIG. 8. More specifically, FIG. 10 shows a solder bump 30 electrically and mechanically connected between the structure of FIG. 8 and a laminate 32. The solder bump 30 may be formed using conventional C4 processes.

Design Structure

Figure 11:
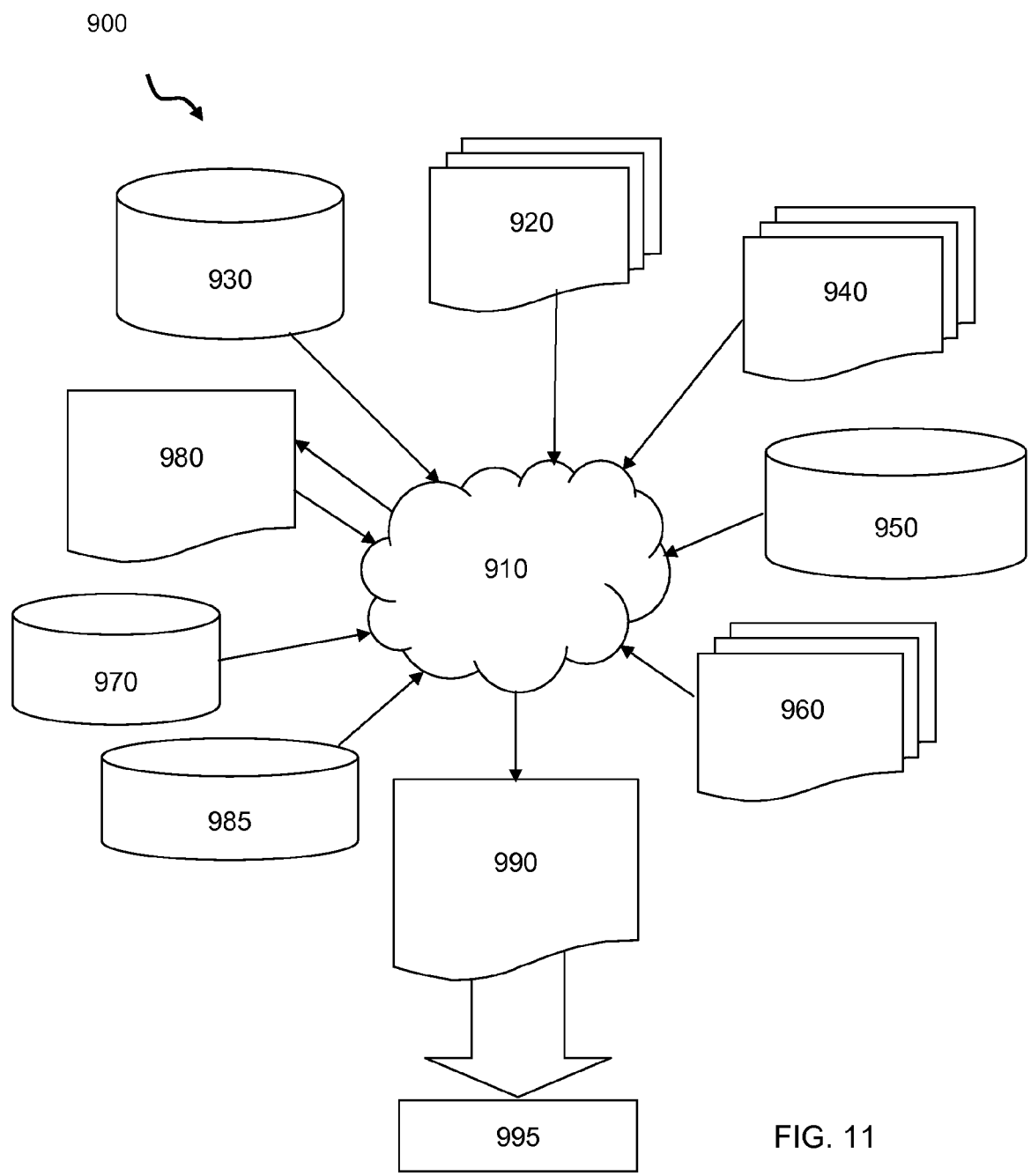
FIG. 11 is a flow diagram of a design process used in semiconductor design, manufacture, and/or test.

FIG. 11 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design from 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 7-10 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIGS. 7-10. Design process 910 preferably synthesizes (or translates) an embodiment of the invention as shown in FIGS. 7-10 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 7-10, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 7-10. Design structure 990 may then proceed to a stage 995 where, for example, design structure 990: proceeds to tape-out, is released to manufacturing, is released to a mask house, is sent to another design house, is sent back to the customer, etc.

The structures as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those of skill in the art will recognize that the invention can be practiced with modifications and in the spirit and scope of the appended claims.

What is claimed is:

1. A method, comprising:
    forming a design sensitive structure comprising a portion of a higher wiring layer electrically and mechanically connected to an underlying via farm;
    forming a dielectric layer over the design sensitive structure;
    forming an opening in the dielectric layer to expose a portion of the higher metal layer that is away from the via farm, wherein a portion of the dielectric material protects the design sensitive structure;
    forming a passivation layer over the dielectric material and the opening; and
    forming an opening in the passivation layer at least partially aligned with the opening in the dielectric material and overlapping the via farm.

2. The method of claim 1, wherein the opening in the passivation layer is formed larger than the opening in the dielectric material.

3. The method of claim 1, further comprising forming an interconnecting metal in the opening of the dielectric material.

4. The method of claim 3, wherein the dielectric material remains between the interconnecting metal and a portion of the upper wiring layer which is over the underlying via farm.

5. The method of claim 1, further comprising reflowing solder into the opening of the passivation layer to form a solder bump.

6. The method of claim 5, wherein the solder bump electrically contacts an interconnecting metal, through the opening formed in the passivation layer, and a laminate structure.

7. The method of claim 1, wherein the dielectric material has a higher strength than a mechanical connection between the higher wiring layer and the underlying via farm.

8. The method of claim 1, wherein the passivation layer does not overlap the via farm.

* * * * *